United States Patent [19]
Ott et al.

[11] Patent Number: 5,311,138
[45] Date of Patent: May 10, 1994

[54] DEVICE FOR MONITORING THE FUNCTON OF AN ELECTRIC LOAD, ITS DRIVE AND THE ASSOCIATED CONNECTIONS

[75] Inventors: Karl Ott, Markgröningen; Rudi Mayer, Vaihingen/Enz; Helmut Denz; Hans-Peter Ströbele, both of Stuttgart; Reinhard Palesch, Eberdingen-Hochdorf; Jürgen Eckhardt, Schwieberdingen, all of Fed. Rep. of Germany

[73] Assignee: Robert Bosch GmbH, Stuttgart, Fed. Rep. of Germany

[21] Appl. No.: 778,172

[22] PCT Filed: Mar. 22, 1991

[86] PCT No.: PCT/DE91/00255
§ 371 Date: Dec. 13, 1991
§ 102(e) Date: Dec. 13, 1991

[87] PCT Pub. No.: WO91/16637
PCT Pub. Date: Oct. 31, 1991

[30] Foreign Application Priority Data
Apr. 14, 1990 [DE] Fed. Rep. of Germany ....... 4012109

[51] Int. Cl.$^5$ ............................................. G01R 31/02
[52] U.S. Cl. .................................... 324/503; 324/509; 324/522; 340/650
[58] Field of Search ............... 324/503, 509, 510, 522, 324/537; 340/660, 661, 650; 361/79, 88, 90

[56] References Cited

U.S. PATENT DOCUMENTS

| | | | |
|---|---|---|---|
| 4,306,270 | 12/1981 | Miller et al. | 361/90 |
| 4,574,266 | 3/1986 | Valentine | 340/635 |
| 4,694,372 | 9/1987 | Sibeud | 340/660 |
| 4,884,033 | 11/1989 | McConchie, Sr. | 324/503 |
| 4,962,350 | 10/1990 | Fukuda | 361/79 |
| 5,173,832 | 12/1992 | Giorgetta et al. | 340/660 |

FOREIGN PATENT DOCUMENTS

3121645 12/1982 Fed. Rep. of Germany .
87/00079 12/1987 PCT Int'l Appl. .

*Primary Examiner*—Kenneth A. Wieder
*Assistant Examiner*—Christopher Tobin
*Attorney, Agent, or Firm*—Kenyon & Kenyon

[57] ABSTRACT

Circuitry for monitoring the function of electric load, an output stage and a control circuit for driving the output stage and the lines that connect these elements. The circuitry includes at least one fault acquisition logic that is connected in parallel with the output stage. The fault acquisition logic has a terminal that connects to an input of the output stage and another terminal that connects to the output of the output stage. The fault acquisition logic also is connected to a reference potential. The fault acquisition logic has a comparator for comparing potentials for determining fault conditions. Detected fault conditions may be stored in a buffer memory that connects to a main memory. The buffer memory may also have a time delay associated with it. The circuitry also may include a coder for encoding signals indicative of the fault conditions that are detected by the fault acquisition logic. The circuitry may further include a safety disconnect to protect the output stage against overload.

11 Claims, 4 Drawing Sheets

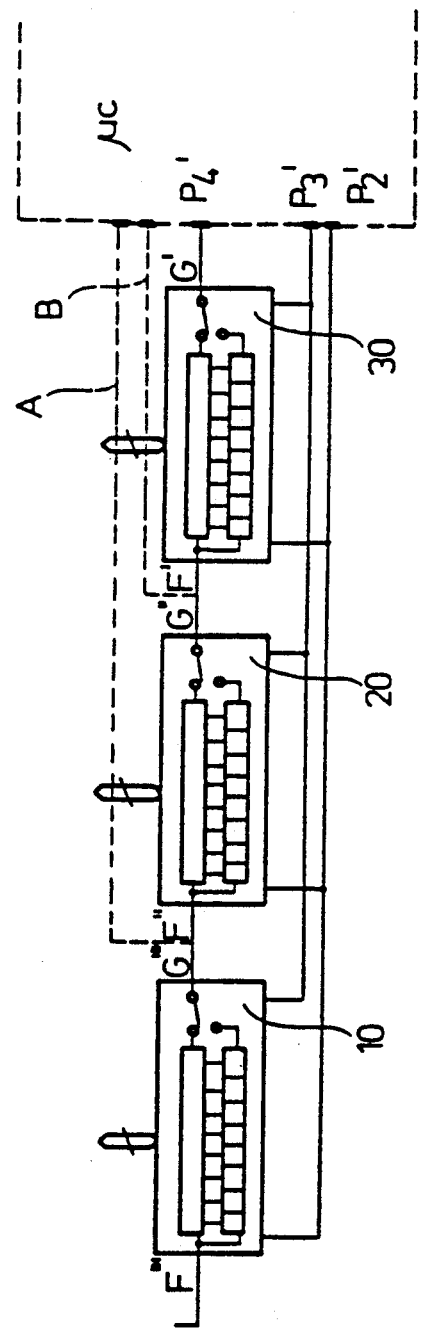

DEVICE FOR MONITORING THE FUNCTON OF AN ELECTRIC LOAD, ITS DRIVE AND THE ASSOCIATED CONNECTIONS

FIELD OF THE INVENTION

The present invention relates to circuitry for monitoring the function of an electric load, the output stage and control circuit that drive the electric load, and the lines that connect these elements.

BACKGROUND OF THE INVENTION

Function monitoring circuits are known. These known circuits, however, do not distinguish between load drop-outs and short circuits to earth of an assembly, do not have any fault storage capacity which means that there can only be on-line fault detection, handle fault detection using a control circuit, and require extensive software search routines for fault detection and detection of the fault path and type.

One of the known function monitoring circuits uses the drive pins for signalling the output potentials of the output stage. During this process, it is determined whether the output stage which contains a transistor has assumed the "high" or "low" output potential. As a result, it can be determined after a software comparison of the input and output signal whether a short circuit of the output stage to the supply voltage or to the positive potential or to earth is present.

In another known function monitoring circuit, the output potentials of the output stages are signalled via a serial interface.

Another function monitoring circuit which is known signals several output stages simultaneously. These output stages, which are signaled by the function monitoring circuit, short circuit to the supply voltage and the load drops out on one side, and the load short circuits to earth on the other side at one connection pin each.

In this circuit, it is not possible to distinguish between faults—load drop-out and short circuits to earth. To make it possible to allocate the fault to one output stage, an extensive software search routine is necessary.

SUMMARY OF THE INVENTION

The circuitry according to the present invention is for monitoring the function of an electric load, the output stage and control circuit for driving the electric load, and the lines that connect these elements. The fault monitoring circuit of the present invention has ability to reliably distinguish between possible fault conditions such as the short circuits to earth, short circuits to positive potentials, and load drop-outs, with little hardware and software expenditure, particularly, without extensive software search routines. The function monitoring circuit of the present invention also detect the proper operation of the output stage, electric load, control circuit, and lines connecting the output stage to the electric load and control circuit.

In the circuit arrangement for the electric load disclosed herein, the electric load may be connected to earth and be driven by a so-called high-side output stage and it can connected to a positive potential and be driven by a so-called low-side output stage. The present invention also permits monitoring of both inverting and non-inverting output stages. In addition, the circuitry according to the present invention may be included in existing control circuits without difficulty. In the overall concept, the functioning monitoring circuit of the present invention, and each of the monitoring circuit's individual components can be constructed, hybridized, and integrated.

The circuitry of the present invention has at least one fault detection circuit connected in parallel with the output stage that with the control circuit is used for driving a load. The faults that are detected can be distinguished by a comparison of the input and output potentials. To detect the load drop-out, a further potential is applied to the output stage. This potential can be evaluated when a connecting line to the load drops out. This potential can be generated, for example, by means of a voltage source and an internal resistance, an operational or comparator circuit or by means of a current source and so forth. Due to the fact that the function monitoring circuit is connected in parallel with the output stage of the load, no intervention into the control circuit is required for monitoring the function of the load, the function of the output stage, and the function of the associated connections. As a result, this circuit can be retrofitted in a simple manner. In addition, it is of simple construction so that the device can be inexpensively produced.

According to the present invention, the function monitoring circuit preferably has fault acquisition logic that is associated with a memory. Due to the fact that faults are stored in the memory, faults can be asynchronously interrogated, that is to say independently upon the occurrence of a fault. The memory can be arranged in such a manner that it can be used at the same time as an output unit, for example, as a shift register for a subsequent serial interface or as an output latch for a parallel interface. This does not impair the operation of the control circuit since the fault does not need to be processed on line.

In addition, according to the present invention, the function monitoring circuit preferably includes a buffer memory that is disposed between the memory and fault acquisition logic. Faults are stored in the buffer memory immediately after they are detected. At the same time, the occurrence of a fault is signalled by a corresponding signal at a port of the function monitoring circuit. On interrogation by a control circuit, the fault is transferred from the buffer memory into the memory. The memory signals the control circuit that this transfer has taken place. This embodiment has the advantage that when the fault transmission to the control circuit is interrupted, the fault status can be loaded again from the buffer memory into the memory and is then again transmitted. Furthermore, the buffer memory can be overridden by the fault acquisition logic, that is to say the buffer memory is also reset if the output stage fault no longer occurs. If the type of fault changes, the current fault is written into the buffer memory. This has the advantage that the control circuit can at any time obtain the current fault status.

Further, according to the present invention, the function monitoring circuit includes a buffer memory that has a time delay means associated with it. This has the advantage that implausibilities between output stage input and output, caused by, for example, transit times at the output stage, are gated out and do not appear as fault messages. Similarly, loads with a slowly decaying switching-on current, for example, lamp output stages, can be monitored with the aid of this device. Due to the initially very high switching-on current, a short circuit of the load could be falsely assumed. Since, however, a fault case is only read into the buffer memory after the delay time of the timing element has elapsed, the switching-on current can first decay.

In accordance, with a further development of the present invention, the function monitoring circuit can be equipped with a coder which follows the fault acquisition logic. Since two or more fault types cannot occur simultaneously, the fault type can be coded with the aid of a coding circuit as a result of which storage space can be saved in the buffer memory/memory. In addition, a read-out cycle of the memory consumes less time in accordance with the reduced number of bits.

Further developments and advantages of the invention will be described subsequently. It is particularly advantageous if the function monitoring circuit of the present invention is provided with a safety circuit which, in the case of a fault, applies a control signal to the output stage. This signal causes the output stage and the electric load to be disconnected. This makes it possible to avoid destruction of the output stage with an overload, for example, with a short circuit to a positive potential (with low-side output stage) or to earth (with high-side output stage).

In accordance with the function monitoring circuit of the present invention, a circuit variant is preferred in which a signal is applied to a port of the function monitoring circuit when a fault occurs (for example the output of the serial interface), so that the fault occurrence is immediately signalled to a higher-level control circuit and the control circuit can initiate a read-out of the fault memory.

BRIEF DESCRIPTION OF THE DRAWINGS

FIG. 4 shows a block diagram of function monitoring circuits according to the present invention that are cascaded.

DETAILED DESCRIPTION OF THE DRAWINGS

Figure 1:
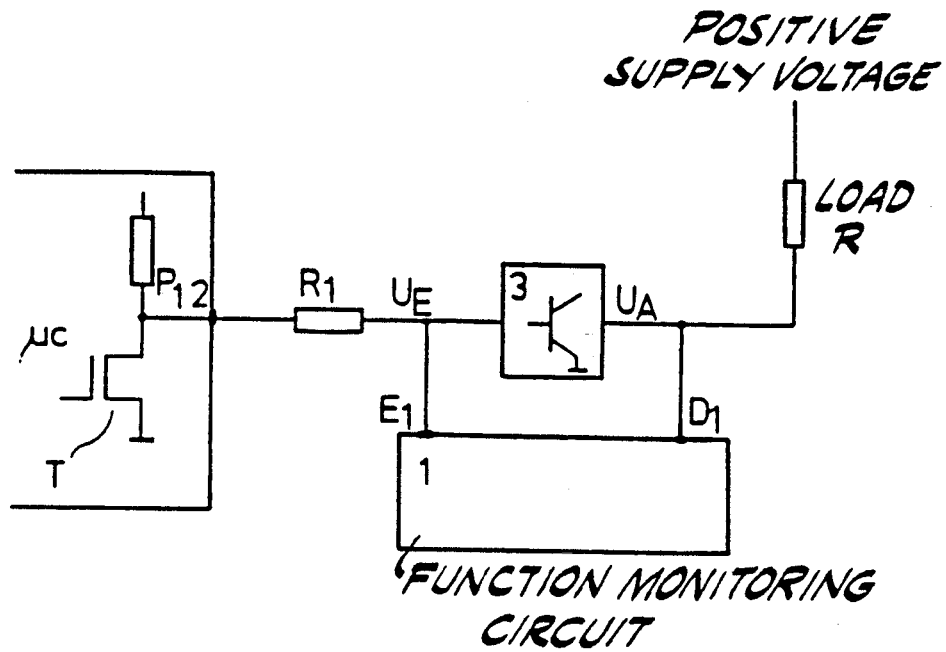
FIG. 1 is a schematic diagram of function monitoring circuit of the present invention included in a circuit.

The basic principal of fault detection based on the present invention can be understood from the schematic diagram of FIG. 1. The circuitry of the present invention for monitoring the function of an electric load is connected in parallel with the output stage indicated by the amplifier symbol 3, of a load R. In this arrangement, the input terminal $E_1$ of the function monitoring circuit 1 is connected to the input indicated by $U_E$ and the terminal $D_1$ of the function monitoring circuit 1 is connected to the output, identified by $U_A$, of the output stage 3. In the text which follows, it is assumed that the output stage is a non-inverting output stage, but the fault detection principle can also be used for an inverting output stage.

In FIG. 1, a so-called "low-output stage" is shown, that is to say the load R that is connected to a positive potential is connected to earth when switched on via the output stage 3. The fault detection principle, however, can be easily used with "high-side output stages".

The output stage 3 is driven by the control circuit $\mu C$ (in this case via a resistor $R_1$). For reasons of clarity, only the driver stage of the control circuit and only one output stage with load R is shown in this case.

Figure 2:
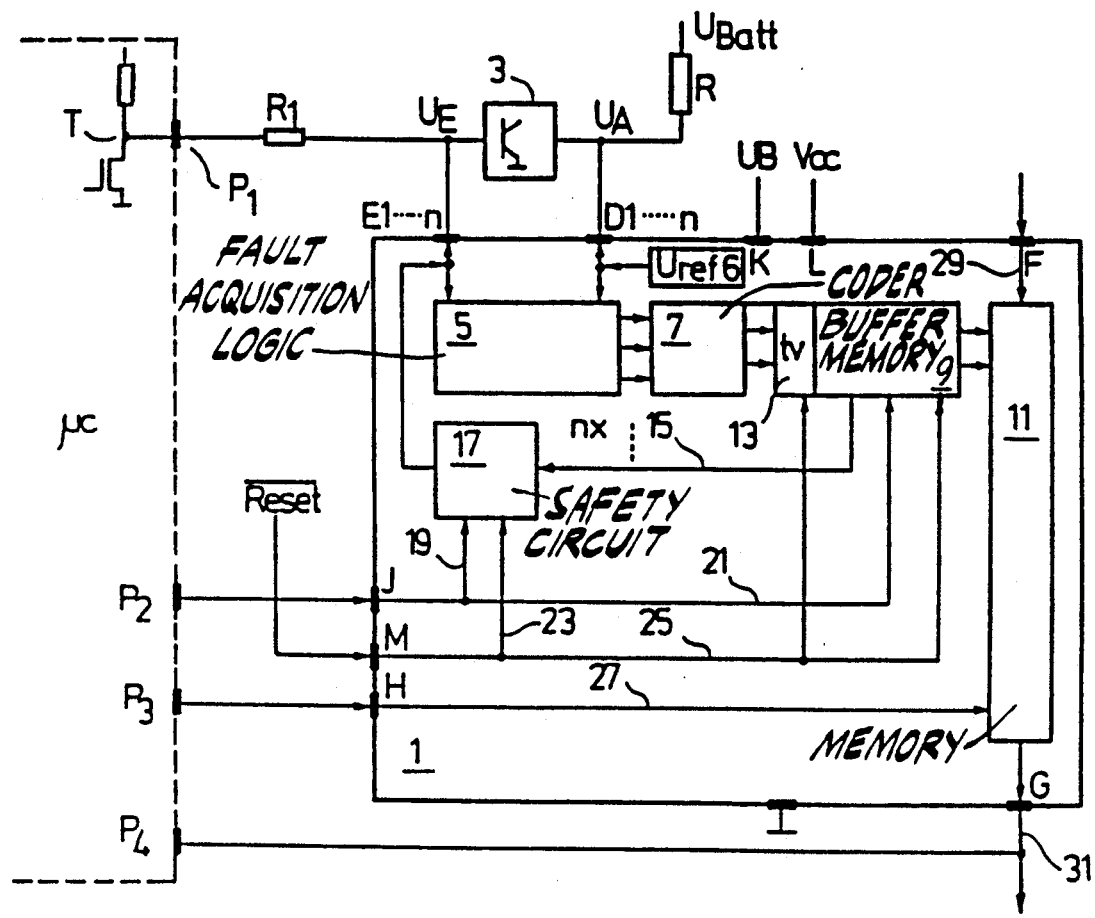
FIG. 2 is a block diagram of the function monitoring circuit of the present invention.

The block diagram according to FIG. 2 shows in detail the function monitoring circuit 1 which is connected in parallel with one output stage.

The output of the output stage 3 is provided with a device 6 for level addition which can be a diode D and a so-called pull-up resistor $R_p$ on a supply-voltage-dependent reference voltage $U_{ref+}$. In other embodiments, the device for level addition could also consist, for example, of a current source, or an operational amplifier circuit, or a comparital circuit and so forth.

The function monitoring circuit 1 includes fault acquisition logic 5 which, on one side, is connected via an input port $E_1$ to the input terminal $U_E$ of the output stage 3 and, on the other side, via a port $D_1$ to the output terminal $U_A$ of the output stage. The port $E_1$ is equipped with a circuit device which detects the output stage input levels "low" and "high". The input/output $D_1$ is provided with a circuit device which can detect the output stage output levels "low", "high" and $U_{ref}$.

The voltage levels for the embodiment shown in FIG. 2 is for a 12-V automobile electrical system. This electrical system is to be considered only an example. The voltage levels that are generated and tracked are dependent upon the positive potential.

The fault acquisition logic 5 of the function monitoring circuit 1 can distinguish between the following states (in this case, for example, for a non-inverting output stage:

1. If the input terminal $U_E$ of the output stage 3 is at low potential and, as a result, the latter conducts, or is turned on, a short circuit of the load R to the positive potential is assumed if a potential of $>3$ V is present at the output terminal $U_A$ of the output stage 3.

2. If the input terminal $U_E$ of the output stage 3 is at high potential and, as a result, the output stage 3 is turned off, a short-circuit to earth is assumed if a potential of $<3$ V is present at the output terminal $U_A$.

3. If the input terminal $U_E$ of the output stage 3 is at a "high" and, as a result, the output stage 3 is turned off, a load drop-out, an interruption of the load line, is assumed when the potential $U_{ref}$ between 3 V and 7 V, is present at the output terminal $U_A$ of the output stage and the output stage 3 is turned off.

The result is therefore that with a conducting output stage, a potential of between 0 V and 3 V is present at the output terminal $U_A$ if a normal fault-free operation is given. When the output stage is turned off, a normal fault-free operation is given when the output potential at the output terminal is $U_A>7$ V.

The three voltage ranges, 0 V to 3 V, 3 V to 7 V and $>7$ V can be distinguished on the basis of the positive potential, the reference potential, and the earth potential. Thus, three fault cases, short circuit to positive potential, short circuit to earth, and load drop-out can be directly distinguished in conjunction with the input voltage level.

The fault acquisition logic 5 is followed by a coder 7 which is connected to a buffer memory 9. The output signals of the buffer memory are supplied to a memory 11 which has an output terminal connected to an output port G of the function monitoring circuit 1. FIG. 2 shows that the buffer memory has a device 13 for time delay 13. This time delay circuit has a delay time tv.

The buffer memory 9 is connected via line 15 to a safety circuit 17 which is connected to the input port E1 of the function monitoring circuit 1 and thus to the input terminal UE of the output stage 3.

An input terminal J of the function monitoring circuit is connected to a synchronization port $P_2$ of the control circuit. Another input terminal H of the function monitoring circuit 1 is connected to a port $P_3$, outputting the clock signal, of the control circuit μC. Finally, an inverted reset signal is applied to a further input terminal M of the function monitoring circuit 1.

The synchronization signal is applied via suitable lines 19 and 21 to the safety circuit 17 and to the buffer memory 9. Similarly, the inverted reset signal is applied via lines 23 and 25 to the safety circuit 17 and to the buffer memory 9 and to its timing section 13. Finally, the clock signal of the port $P_3$ is applied to the memory 11 via a line 27.

Additional function monitoring circuits can be connected with the one shown in FIG. 2 via the port F which connects to memory 11 via a line 29.

Port G is also used to connects to other function monitoring circuits (FIG. 4). Port G also connects to a serial interface of the μC via a line 31. As shown, line 31 connects to a port $P_4$ of the μC.

The function monitoring circuit 1 has even further ports K and L to which, on one side, a supply voltage $U_{Batt}$ and another voltage $V_{cc}$ are applied.

In the representation in FIG. 2, only a logic circuit 5, which is connected to the ports $E_1$ and $D_1$ of the function monitoring circuit 1 and which is allocated to an output stage 3, has been provided for reasons of better clarity. However, it is possible to provide several logic circuits, for example, n circuits, which are connected via the remaining ports $E_2$ to $E_n$ and $D_2$ to $D_n$ to corresponding output stages. The number of coders 7, buffer memories 9 and safety circuits 17 correspond to that of the logic circuits 5. Even with n logic circuits, however, only one memory 11 having a corresponding number of bits is provided.

Figure 3:
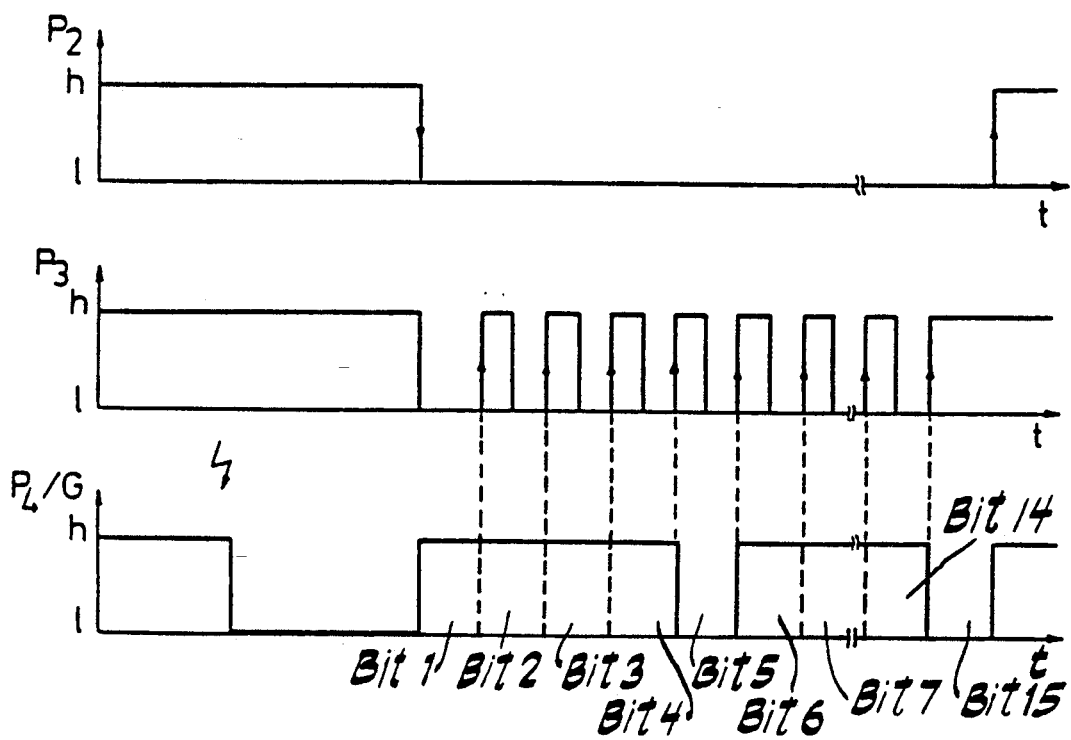
FIG. 3 shows a possible timing diagram for fault transmission protocol (for example, for a serial interface) of the function monitoring circuit of the present invention.

FIG. 3 shows a possible timing diagram of a fault transmission protocol. The top diagram shows the variation with time of the signal present at the synchronization port $P_2$ of the μC; the center diagram shows the potential variation at clock port $P_3$ and, finally, the bottom diagram shows the potential variation at port G of the function monitoring circuit or, respectively, at port $P_4$ of the μC.

The variation of the potentials at ports $P_2$, $P_3$, and $P_4$ will be discussed in greater detail with reference to the functional description of the function monitoring circuit 1. The operation of the monitoring circuit in FIG. 2 will be discussed in greater detail in the text which follows.

Using the function monitoring circuit 1, the potentials at input $U_E$ and at output $U_A$ of the output stage 3 are subjected to a plausibility check. In this process, the three potential ranges and thus the three fault states can be detected and distinguished with the aid of the window comparator of the logic circuit 5 as explained in greater detail with reference to FIG. 1, namely a short circuit of the load R to the supply voltage $U_{Batt}$, a short circuit to earth, and load drop-out, that is to say an interruption of the feedline to the load R. For this purpose, the potentials present at terminals $E_1$ and $D_1$ of the function monitoring circuit 1 and the reference voltage $U_{ref}$ are compared with one another in the logic circuit 5.

A fault in the output stage 3 is detected with the aid of the fault acquisition logic 5. After the delay time tv set by the buffer memory 9 has elapsed, the fault is simultaneously written into the buffer memory and the occurrence of a fault is displayed via a port (port G in this case). Due to this delay time, false fault messages such as, for example, implausabilities between output stage, input and output potentials, for example due to normal transit time delays in the output stage, are suppressed.

Moreover, the switching-on current in lamp output stages is so great, or the potential at the output terminal $U_A$ is so high that a short circuit of the load R to supply voltage could be diagnosed. The delay time must be selected in such a manner that short-time implausabilities between input and output have been reduced or, respectively, that the switching-on current has decayed after the selected delay time has elapsed. The fault case remains stored in the buffer memory 9 until, if possible, the fault has been remedied. In the case of an intermittent contact, for example, a load drop-out, initially signalled; may no longer be present at a later time. A fault stored in the buffer memory 9 is overridden, that is to say deleted, in the case of a fault remedy.

The port G of the function monitoring circuit 1 is thus set to "low" immediately on expiration of the time delay after a fault has occurred. The fault case remains stored in the buffer memory 9. The control circuit μC can detect the changed potential at the output port G by interrogating its input port $P_4$ and, if necessary, carry out a fault interrogation. This therefore means that the control circuit can carry out a fault interrogation asynchronously, that is to say independently of the occurrence of the fault case.

For this purpose, a signal is output via the synchronization port $P_2$ and the associated line 21 to the buffer memory 9 which thereupon loads the fault message into the memory 11. The memory 11 is suitably connected to an output unit. In this arrangement, for example, a parallel output or a serial output can be connected together. The memory 11 in FIG. 2 is here preferably connected as a shift register with a serial output. This arrangement reduces the number of connections of the function monitoring circuit.

In FIG. 3, a transmission protocol for a serial "fault read-out" is shown.

The fault report loaded into the memory 11 is "clocked out", that is to say the memory content is read out serially, by means of a clock signal at the clock port $P_3$ which reaches the memory 11 via the line 27.

FIG. 3 shows with reference to the bottom diagram the bits set in the memory 11, in this case bits 1-15, are successively read out. The fault type and the fault path, that is to say the output stage at which a fault is present can be determined from the level of the bits in the transmission protocol.

FIG. 3 shows that the clock signals at port $P_3$ are only output as a result of the change of the potential at synchronization port $P_2$. As long as the potential at the synchronization port $P_2$ is at "high", the clock signal has no influence on the input port $P_4$ of the diagnostic interface according to FIG. 3.

What has been set forth above shows that the fault message is transmitted from the buffer memory 9 into the memory 11. In principle, four messages are distinguished: no fault, short circuit to positive potential, short circuit to earth, and load drop-out. Accordingly, 4 bits would also have to be provided for each logic circuit 5, and both in the buffer memory 9 and in the memory 11. It has been set forth above that in the function monitoring circuit 1, up to n logic circuits, that is to say 4 . n bits can be provided in the buffer memory. A corresponding number of bits would also have to be provided in the memory 11.

Since it is not possible for two output stage faults to occur simultaneously at one output stage, the faults are coded in accordance with the following table in the preferred embodiment:

| Fault type | Bit | Bit |
|---|---|---|
| no fault | 1 | 1 |
| short to positive | 0 | 0 |
| load drop-out | 1 | 0 |
| short to earth | 0 | 1 |

Short here designates a short-circuit case.

This coding is carried out in the coder 7 which is arranged between the fault acquisition logic 5 and the buffer memory 9. This reduces the number of required bits per fault acquisition logic 5 to two, both in the buffer store 9 and in the memory 11.

In the case of seven output stages, only fourteen bits therefore have to be provided in the memory 11.

To check the diagnostic interface for fault-free transmission of the fault report from the memory 11 to the control circuit $\mu C$, an additional bit is provided at the end of the memory 11 which must appear as the last bit, as bit 15 in FIG. 3, also at port P4 of the serial interface. In a fault transmission protocol, this last (fifteenth) bit must be "low" when a fault-free transmission has occurred. This is indicated in the bottom diagram in accordance with FIG. 3.

If the test bit is not "low" during the interrogation of the fault transmission protocol, the fault transmission protocol stored in the buffer memory 9 can again be transmitted into the memory 11 and interrogated from there by means of a signal sequence according to FIG. 3.

During the transmission of the fault protocol from the memory 11, the bits are serially interrogated. This makes it possible to carry out an unambiguous allocation of the fault bits to the associated fault acquisition logic 5 and, respectively, to the corresponding output stage 3. It can thus be easily determined from the fault transmission protocol at which output stage allocated to the function monitoring circuit 1, a fault has occurred and the type of the fault existing there. Thus, an unambiguous fault allocation and discrimination can be effected.

The function monitoring circuit 1 is additionally provided with a safety disconnect 17 which is connected to the buffer memory 9 via the line 15. When a short circuit occurs which could damage the output stage (short circuit to supply voltage with low-side output stage or short circuit to earth with high-side output stage), a signal is given via line 15 to the safety disconnect which thereupon disconnects the associated output stage 3.

In the embodiment of the present invention shown in FIG. 2, the input terminal of the output stage is connected to a level which ensures an inactive output stage. In this manner, the load R is also immediately disconnected with a short circuit to earth or to the supply voltage so that damage is virtually impossible. Due to a disconnect delay, the output stage should be short-circuit resistant for a short time so that damage is avoided until disconnection occurs by the safety circuit 17.

Once the output stage has been disconnected, it is released again via connection line 19 and safety disconnect 17 when the fault transmission protocol is read out of the memory 11. However, the fault case "short circuit to positive potential" remains stored in the buffer memory 9 until it is reset by a possible fault remedy. As long as the fault is present, the output stage is disconnected again after each read-out process. All fault or buffer memories 9 can be reset in a defined manner by the inverted reset signal at the input port M of the function monitoring circuit 1. For this purpose, the reset signal is transmitted to the buffer store 9 via the line 25.

The function monitoring circuit 1 can also be initialized or disconnected in a defined manner by the inverted reset signal. For this purpose, the reset signal is additionally transmitted via the line 23 to the safety disconnect which is used for disconnecting the output stage, that is to say the output stage including loads are disconnected by applying a corresponding input level to the output stage.

Loads which should or must not be disconnected during the initialization of the function monitoring circuit 1 are appropriately driven by the control circuit, that is to say the resistor $R_1$ located between the output port $P_1$ of the control circuit $\mu C$ and the input terminal $U_E$ of the output stage is omitted in these output stages. Instead, it is placed into the connecting line between the input terminal $U_E$ of the output stage and the associated port E1 of the function monitoring circuit 1. This leads to the associated load not being disconnected even when the safety circuit 17 is activated.

In addition, the output stage can be disconnected via the safety circuit 17 for safety reasons when the reset signal is set so that undefined potentials at the output port of the control circuit $\mu C$ do not lead to malfunctions of the loads.

Overall, it can be recognized that faults can be allocated to the individual output stages and distinguished by a fault monitoring circuit 1 shown here.

It can be easily seen that the function monitoring circuit can be allocated without difficulty to the output stages of loads because only a parallel circuit is provided. No interventions in the associated output stage are needed. In this manner, the function monitoring circuit that has been described can be used universally and in a simple manner. Using the circuit described, simple and thus inexpensive output stage modules become short-circuit resistant and diagnosable.

Finally, it must be noted that fault monitoring circuits as described here can be cascaded. A possible cascade circuit is shown in FIG. 4.

In the embodiment of the present invention shown in FIG. 4, three fault monitoring circuits 10, 20, 30 are allocated to one control circuit $\mu C$. The output stages of the most important loads are allocated to the monitoring circuit 30 which is directly connected to the control circuit $\mu C$. In this arrangement, the output port G' of this monitoring circuit is allocated to the input port P4' of the control circuit. The purpose of this is that the fault message of the most important output stages is first available during an interrogation. The output terminal G'' of the fault monitoring circuit 20 is connected to port F' of the fault monitoring circuit 30. Correspondingly, the output port G''' of the fault monitoring circuit 10 is connected to the port F'' of the fault monitoring circuit 20.

A clock signal is applied to all fault monitoring circuits via the port $P_3'$ of the control circuit, as is a synchronization signal present at port $P_2'$ of the control circuit.

As soon as a fault is detected by one of the fault monitoring circuits, the "low" potential is applied to port $P_4'$ of the control circuit $\mu C$. The fault interrogation occurs in accordance with the explanations for FIG. 2, that is to say the faults existing in the fault circuits 10, 20 and 30 are serially gated out of the corresponding memories as has been explained with reference to FIG. 2 and the associated memory 11.

Dashed lines A and B show that the fault protocols existing in the fault monitoring circuits 10, 20 and 30 can also be interrogated in parallel by the control circuit $\mu C$ in order to reduce the read-off time.

We claim:

1. Circuitry for monitoring the function of an electric/electronic circuit, the electric/electronic circuit including an electric load, at least one output stage, a connecting line that connects the output stage to the electric load, and a control circuit that connects to the output stage, comprising:
    (A) at least one fault acquisition logic circuit that is connected in parallel with the output stage, the fault acquisition logic circuit being for detecting the occurrence of fault conditions including a short circuiting of the load, a short circuiting of the output stage, and an interruption in the connecting line, the fault acquisition logic circuit further comprising,
        (1) a first terminal connected to an input potential of the output stage,
        (2) a second terminal connected to an output potential of the output stage,
        (3) means for applying a reference potential at a predetermined level to at least one of the first and second terminals for distinguishing between a short circuiting of the output stage and an interruption in the connecting line, and
        (4) comparator means for comparing at least one preselected threshold potential and potentials associated with the output stage; and
    (B) storage means for storing signals indicative of detected fault conditions.

2. The circuitry as recited in claim 1, wherein the output stage includes one of inverting and non-inverting output stages.

3. The circuitry as recited in claim 1, wherein the output stage includes one of low-side and high-side output stages.

4. The circuitry as recited in claim 1, wherein the storage means includes a first memory and a second memory, with the first and second memories being connected.

5. The circuitry as recited in claim 4, wherein the first memory includes a buffer memory.

6. The circuitry as recited in claim 2, wherein the buffer memory is a temporary storage for signals indicative of detected fault conditions.

7. The circuitry as recited in claim 5, further comprising a time delay device coupled to the buffer memory.

8. The circuitry as recited in claim 1, wherein the circuitry further includes a coder means for encoding the signals indicative of detected fault conditions.

9. The circuitry as recited in claim 1, wherein the circuitry further includes a safety circuit for protecting the output stage.

10. The circuitry as recited in claim 1, wherein the storage means connects to the control circuit which inputs a control signal to the storage means for reading-out the predetermined information stored in the storage means.

11. The circuitry as recited in claim 1, wherein the circuitry includes a plurality of cascaded circuitries.

* * * * *

UNITED STATES PATENT AND TRADEMARK OFFICE
CERTIFICATE OF CORRECTION

PATENT NO. : 5,311,138
DATED : May 10, 1994
INVENTOR(S) : OTT et al.

It is certified that error appears in the above-indentified patent and that said Letters Patent is hereby corrected as shown below:

Column 1, line 56, change "detect" to --detects--;

Column 6, line 38, change "is here" to --is--;

Column 10, line 18, change "2" to --5--.

Signed and Sealed this

Twenty-second Day of November, 1994

Attest:

BRUCE LEHMAN

*Attesting Officer*   *Commissioner of Patents and Trademarks*